(12) United States Patent
Hibbs

(10) Patent No.: US 9,405,032 B2
(45) Date of Patent: Aug. 2, 2016

(54) METHODS, SYSTEMS AND APPARATUSES FOR SENSING AND MEASURING THE ELECTRIC FIELD WITHIN THE EARTH

(75) Inventor: Andrew D. Hibbs, La Jolla, CA (US)

(73) Assignee: GroundMetrics, Inc., San Diego, CA (US)

(*) Notice: Subject to any disclaimer, the term of this patent is extended or adjusted under 35 U.S.C. 154(b) by 307 days.

(21) Appl. No.: 13/980,794

(22) PCT Filed: Jan. 20, 2012

(86) PCT No.: PCT/US2012/022105
§ 371 (c)(1),
(2), (4) Date: Jul. 19, 2013

(87) PCT Pub. No.: WO2012/100217
PCT Pub. Date: Jul. 26, 2012

(65) Prior Publication Data
US 2013/0300419 A1 Nov. 14, 2013

Related U.S. Application Data

(60) Provisional application No. 61/434,951, filed on Jan. 21, 2011.

(51) Int. Cl.
*G01V 3/08* (2006.01)
*G01R 15/16* (2006.01)

(52) U.S. Cl.
CPC .............. *G01V 3/088* (2013.01); *G01R 15/165* (2013.01)

(58) Field of Classification Search
CPC ........... G01V 3/088; G01V 3/00; G01V 3/02; G01V 3/04; G01V 3/06; G01V 3/08; G01V 3/12; G01V 3/18; G01V 3/20; G01V 3/26; G01R 15/165; G01R 15/16; G01R 27/18; G01R 27/20; G01R 27/205
See application file for complete search history.

(56) References Cited

U.S. PATENT DOCUMENTS 5,087,873 A * 2/1992 Murphy .................... G01V 3/06
204/196.06
5,473,244 A * 12/1995 Libove ..................... G01R 1/22
324/126

(Continued)

OTHER PUBLICATIONS

LaBrecque et al., "*Assessment of Measurement Errors for Galvanic-Resistivity Electrodes of Different Composition*", Geophysics, vol. 73, No. 2, Mar.-Apr. 2008, pp. F55-F64.
Petiau, "*Second Generation of Lead-Lead Chloride Electrodes for Geophysical Applications*", Pure and Applied Geophysics, No. 57, 2000, pp. 357-382.

(Continued)

*Primary Examiner* — Tung X Nguyen
*Assistant Examiner* — David Frederiksen
(74) *Attorney, Agent, or Firm* — Diederiks & Whitelaw, PLC

(57) ABSTRACT

Methods, systems, and apparatuses for measuring an electric potential in the earth, which includes a first sensor are disclosed. The first sensor includes a sensing plate for placement in an environment in close proximity to the earth. The sensing plate has an operative capacitive coupling with the earth and measures the earth's electric potential. The sensor also includes a barrier providing electrochemical segregation between the sensing plate and the earth and an amplifier having at least one stage for receiving and amplifying a first signal carrying the potential measured by the sensing plate. The sensor also includes a first connection carrying the first signal from the sensing plate to the amplifier; and a reference voltage for application to the first stage of the amplifier, the reference voltage providing a reference against which the potential measured by the sensing plate is compared. Other embodiments are described and claimed.

28 Claims, 8 Drawing Sheets

(56) References Cited

U.S. PATENT DOCUMENTS

| | | | |
|---|---|---|---|
| 6,223,129 B1 | 4/2001 | Chan et al. | |
| 6,466,036 B1 * | 10/2002 | Philipp | G01D 5/24 |
| | | | 324/658 |
| 6,686,800 B2 | 2/2004 | Krupka | |
| 6,961,601 B2 | 11/2005 | Matthews et al. | |
| 7,330,033 B2 | 2/2008 | Nakamura | |
| 7,411,391 B2 | 8/2008 | Desplats et al. | |
| 8,154,420 B2 | 4/2012 | Petrovic et al. | |
| 8,258,790 B2 | 9/2012 | Folberth et al. | |
| 2002/0190728 A1 * | 12/2002 | Gandrud | G01N 33/42 |
| | | | 324/663 |
| 2005/0270032 A1 | 12/2005 | McQueeney | |
| 2007/0046289 A1 * | 3/2007 | Troxler | G01N 33/42 |
| | | | 324/334 |
| 2010/0253369 A1 * | 10/2010 | Izadnegahdar | G01N 27/223 |
| | | | 324/664 |
| 2011/0273188 A1 * | 11/2011 | Aubry | B60R 16/02 |
| | | | 324/649 |
| 2012/0232810 A1 | 9/2012 | Kaipio et al. | |

OTHER PUBLICATIONS

Foo et al., "*Capacitive-Coupled Electric-Field Sensing for Urban Sub-Surface Mapping: Motivations and Practical Challenges*", 1$^{st}$ International Conference on Frontiers in Shallow Subsurface Technology, Jan. 20-22, 2010, Delft, Netherlands, pp. 104.

Kuras et al., "*The Capacitive Resistivity Technique for Electrical Imaging of the Shallow Subsurface*", PhD Thesis, University of Nottingham, Dec. 2002, pp. 1-308.

Shima et al., "*Developments of Non-Contact Data Acquisition Techniques in Electrical and Electromagnetic Explorations*", Journal of Applied Geophysics, 35 (1996) 167-173.

\* cited by examiner

METHODS, SYSTEMS AND APPARATUSES FOR SENSING AND MEASURING THE ELECTRIC FIELD WITHIN THE EARTH

CROSS-REFERENCE TO RELATED APPLICATIONS

This application represents a National Stage application of PCT/US2012/022105 entitled "Methods, Systems and Apparatuses for Sensing and Measuring the Electric Field within the Earth" filed Jan. 20, 2012, pending, which claims the benefit of U.S. Provisional Patent Application Ser. No. 61/434,951 filed Jan. 21, 2011.

FIELD OF THE INVENTION

The present disclosure relates generally to systems, methods, and apparatuses for measuring electric fields in an examined medium, such as the Earth. More particularly, the invention relates to systems, methods and apparatuses for sensing and measuring electric fields in terrains in which present electrochemical-based electrodes that rely on ionic exchange with their local environment cannot function adequately.

BACKGROUND OF THE INVENTION

The embodiments described herein relate generally to the field of sensing and measuring electronic fields in earth. In this application, the term "earth" is used to refer generally to the lithosphere of the Earth, and more generally to any region wherein a geophysical survey might be conducted. This lithosphere may comprise one or more of any naturally occurring materials such as soil, sand, rock, dry salt, or permafrost, or be man-made, such as asphalt or concrete.

In embodiments of the present invention disclosed herein, the term "electrical conductivity" is used even though electrical resistivity is the inverse of electrical conductivity and the two terms can be interchanged without any loss of meaning or generality. Due to physical-chemical polarization processes that accompany current flow in the earth, the electrical conductivities of earth materials such as rocks and/or fluids are complex and frequency-dependent. One or more embodiments of the present invention disclosed herein can be applied to measuring electric fields for interpretation as the conductivity and/or dielectric permittivity and/or induced polarization relaxation terms such as, but not limited to, chargeability and/or time constant and/or frequency constant, of geological structures and/or man-made objects.

Electromagnetic (EM) soundings probe electrical conductivity as a function of lateral position and depth in the earth. Geological structures and/or man-made objects of interest include, but are not limited to, mineral deposits, hydrocarbon reservoirs, Enhanced-Oil-Recovery/Improved-Oil-Recovery injected fluids and in-situ fluids, hydrofracturing injected fluids and slurries, groundwater reservoirs, fluid fronts, contaminants, permafrost, weathered layers, infrastructure, tunnels, and underground facilities. Since the conductivities of such objects and the surrounding media are generally quite dissimilar, they can, in theory, be discriminated by means of measurement of the subsurface conductivity. Using this methodology, the depth, thickness, and lateral extent of objects of interest can be determined, depending on the availability of naturally occurring EM sources, or controlled-source EM sources such as a transmitter.

Soundings as related to the invention are primarily targeted at objects at a depth of more than 30 m below the earth's surface. This focus on deeper targets requires frequencies that are generally less than 10 kHz, and most often below 100 Hz. In particular, the requirement for depth and low frequency distinguishes the present invention from apparatuses for resistivity mapping that aim to identify and locate features in the first 10 m, and more preferably the first 5 m, of the earth's surface. In these shallow applications, the requirements for measurement sensitivity at low frequencies and reproducibility are low, and some of the improvements necessary for deep soundings that are provided by the invention may not be needed.

A number of measurement scenarios for sounding are employed, including natural and/or controlled electric and/or magnetic sources with many different source and/or receiver combinations and/or geometries for surface-based configurations, borehole-to-surface configurations, surface-to-borehole configurations, single borehole configurations, and multiple borehole (e.g., cross-borehole) configurations. The principal natural source, or passive, sounding methods include the magnetotelluric (MT) methods, such as audio-magnetotelluric (AMT) and magnetovariational (MV) methods, in which the electric and/or magnetic amplitudes of long-period waves from natural EM sources such as lightning discharges and geomagnetic pulsations are monitored near the surface of the earth in order to determine the subsurface electrical impedance as a function of depth. Controlled-source EM methods include both frequency-domain and time-domain measurements of the fields in response to artificially generated EM fields. In time-domain EM surveys routinely practiced by industry, an antenna measures magnetic fields generated from subsurface currents induced in the earth due to an inductive EM source such as a loop. In electrical resistance tomography (ERT) or resistivity surveys routinely practiced by industry, an array of receiver electrodes measures voltage and/or electric fields generated from subsurface currents induced in the earth by an array of transmitter electrodes. In induced polarization (IP) or spectral induced polarization (SIP) surveys routinely practiced by industry, an array of receiver electrodes measures voltage and/or electric fields generated from subsurface currents induced in the earth by an array of transmitter electrodes. In magnetic induced polarization (MIP) or magnetometric resistivity (MMR) or sub-audio magnetic (SAM) surveys routinely practiced by industry, an array of receiver electrodes measures voltage and/or electric fields generated from subsurface currents induced in the earth due to an array of transmitter electrodes. In controlled-source audio-magnetotelluric (CSAMT) or controlled-source magnetotelluric (CSMT) surveys routinely practiced by industry, an array of receiver electrodes measures voltage and/or electric fields and an array of receiver magnetometers measures magnetic fields generated from subsurface currents induced in the earth due to an array of transmitter electrodes.

A common factor in the aforementioned EM methods is the need for a low noise electric field measurement. In the simplest case, the local electric potential is measured in two locations by electrically conducting electrodes buried at or near the earth's surface. The difference between these measurements divided by the separation distance between the electrodes gives the electric field along the line of separation. The system or method requires amplification of the small earth potentials, in addition to filtering, digitization, and subsequent analysis. The principal limitation of the method is the coupling of the conducting electrodes to the electric potential within the earth.

The goal of extant geophysical electrodes is to make a low resistance, low electrical noise contact to the earth. Present electrodes fall into two categories depending on the frequency of operation. Above 1 Hz, solid metal electrodes (stainless steel, phosphor bronze) are generally hammered into, or otherwise buried in, the earth, as described by LeBreque and Daily, *Assessment of Measurement Errors for Galvanic-Resistivity Electrodes of Different Composition*, 73 GEOPHYSICS. No. 2, at 55-64 (March-April 2008). In addition, water or saline solution is often added to the earth to reduce the contact resistance to the electrode and the electrical resistance of the earth in the immediate vicinity of the electrode. Below 1 Hz, metal/metal salt combination electrodes, such as silver/silver chloride (Ag/AgCl), copper/copper sulfate (Cu/CuSO$_4$), or lead/lead chloride (Pb/PbCl$_2$), are buried in excavated holes. The metal electrode is encased in a pot filled with wet mud (e.g. bentonite) that contains the required ions, such as silver (Ag), copper (Cu), lead (Pb), and chlorine (Cl). For improved performance, the pot is buried in a hole, backfilled by the original earth material or specialized earth material substitutes, mixed with electrolyte. The porous pot couples to the prepared earth by means of the salt solution slowly leaking into the surrounding environment through a porous section of the pot.

FIG. 1 depicts a cross sectional view of a conventional metal/metal salt electrode. For convenience, both solid metal and metal/metal salt electrodes are termed "electrochemical" herein because they rely on an exchange of ions with the earth in order to transfer electric charge, and thereby measure the local electric potential. A further common factor is that solid metal and metal/metal salt electrodes are prepared with the goal of having an electrical contact resistance to the earth of less than 1 kΩ. The electrode of FIG. 1 comprises a body 125 capped with a top cap 100, with solder insulated with heat shrink tubing 110 and hot melt glue 115 holding in place a lead wire 120. Clay mud with electrolyte 130 fills the body 125. The lower end of the body is fitted with a porous plug 140, with a partial PVC block forming a channel 135 above the porous plug 140.

A detailed discussion of the chemical processes and design issues associated with electrochemical electrodes is given by Petiau, *Second Generation of Lead-Lead Chloride Electrodes for Geophysical Applications*, 157 PURE AND APPLIED GEOPHYSICS, at 357-382 (2000) ("Petiau"). The fundamental issue is that the main part of the potential of an electrochemical electrode is given by the Nernst formula:

$$V = V_o + \frac{RT}{nF} \ln a_{M+n} \quad [1]$$

where Vo is the standard potential at 25° C., R is the gas constant, T the temperature, F the Faraday constant (RT/F=25.7 mV at 25° C.), n the metal valency, and $a_{M+n}$ is the metal activity which can be represented by the concentration of the metal ion in solution. The various terms in Equation 1 lead to many practical issues. These issues are most pronounced for metal/metal salt electrodes but also apply to solid metal electrodes, and include the following:

a. Inability to work in very dry earth. An electrochemical reaction requires the migration and transfer of ions to and from the electrode surface, which requires some level of moisture. A porous pot provides a medium and also stabilizes the interface electrical potential at the electrode. However coupling the pot to the surrounding soil is still an issue, particularly in areas of dry, well drained sand, gravel, and/or caliche, because fluid in the pot depletes quickly and inconsistently, leading to failure. Similarly, adding water to the earth only lasts for a limited period of time and results in an electrical connection to the earth that is continually changing.

b. Limited operational lifetime due to electrode degradation. Metal electrodes exposed to earth generally corrode. For porous pots there is a gradual reduction in the salt concentration with the rate of leakage affected by earth conditions and even air humidity. Solution leakage can be addressed by refilling and reburying the electrodes, which otherwise can be used for only 3 to 4 days. Recently electrodes with the salt dissolved in a hard gel have been introduced. (See, for example, Petiau, at 359.) These electrodes, however, must still be buried in mud made with salt water, which will also dissipate over time.

c. Susceptibility to local earth chemistry and conditions. Dissolved ions can affect the interface potentials between dissimilar materials, and damp earth water flowing into the electrode can dilute the salt solution and thereby directly affect the contact resistance and the DC potential (see Equation 1).

d. Temperature drift. This is an inherent problem in electrodes that couple via an electrochemical reaction (see Equation 1).

e. Uncertainty in the proportion of the earth potential that is recorded by the overall system. The input impedance of the first stage amplifier of the data acquisition system and the electrical impedance between the electrode and the earth form an impedance divider network. Variations in the electrode-to-earth impedance cause variations in the amplitude of the recorded signal.

f. Increased noise. Electrochemical reactions have an associated noise, also termed corrosion noise. This has been identified as a limiting factor in underwater geophysics, and is seen in many types of solid metal and metal/metal salt electrodes.

g. Increased setup time. This is due to the need for burial in prepared earth to provide an adequate surface area for a low impedance contact and the time required for the (electrode+earth) system to equilibrate.

h. Environmental and permitting issues. Installation of metal salt electrodes often requires obtaining necessary regulatory approvals/permits, and some electrodes (e.g. cadmium/cadmium chloride (Cd/CdCl$_2$), lead/lead chloride (Pb/PbCl$_2$)) are not allowed in some locations for reasons of environmental contamination. Also, installation of electrodes requires environmental disturbance and invasion. In some environmentally sensitive locations, even digging a hole large enough for a small metal rod electrode requires a lengthy permitting process and complete restoration of the earth after the survey.

The issues listed above are well known and in part set the limits of present EM methods in geophysics. For applications related to long duration monitoring, these issues become serious practical problems that must be addressed. Specifically, it is desirable that the electrodes be emplaced for periods on the order of months to years, depending on the application, compared to the days and weeks standard today, and the variation in the recorded signal due to the properties of the measurement system must be low enough to see very slow, small changes in earth potential over time. Further, it is desirable that the electrodes be robust to changes in earth water content in order to be used as an operational monitoring tool, and the measurement noise must be low enough to collect information a depths of order 10 km.

Other practical issues arise because the earth potentials of interest in electromagnetic soundings are small, on the order of 1 μV, and are typically measured by electrodes spaced 20 m to 100 m apart, necessitating the transmission of very small voltages over a significant distance. The wires used to transfer these voltages to the data acquisition system are susceptible to being buffeted by the wind, which causes the wires to move in the earth's magnetic field and thereby induces spurious voltages to the measurement. The wires can be pinned to the earth to minimize wire motion, but such installation adds time and cost to the survey. Secondly, charged dust particles blown by the wind can induce image charges in the wire that also result in spurious voltages.

Further, the wire used to carry the earth potential signal can act like an antenna, directly picking up electromagnetic interference (EMI). The amount of EMI coupled into the wire depends on the input impedance of the first stage of the data acquisition system. Ideally this input impedance is high in order to provide a degree of immunity to changes in the electrical resistance between the electrode and the earth. However, the higher the input impedance, the higher the EMI that is picked up, resulting in a trade-off. Thus, even when a reliable coupling to the earth has been achieved with an electrochemical electrode, the overall measurement is prone to many additional practical problems.

Based on the above, there exists a need for an electric field measurement system for geophysical soundings that can couple to the earth without involving an electrochemical reaction or needing a low resistance electrical contact. Applications of significant commercial and research interest exist in areas too dry or too cold to be surveyed by existing methods. In addition, an electric field measurement system that is not limited by the physical effects associated with electrochemical coupling would enable new long-term applications including but not limited to the monitoring of: the geological integrity of reservoirs used for $CO_2$ sequestration, hydrocarbon production from reservoirs including gas and water injection, hydrofracture injection of fluids and slurries, fresh water storage, mineral production from in-situ mining, acid mine drainage, contaminants, groundwater, and/or infrastructure integrity. Accordingly, a need is present for methods, systems and apparatuses to sense and measure earth potential using sensors with components that can couple to the earth without having electrochemical reaction with the earth and/or overcome issues discussed above.

SUMMARY

The embodiments of the invention described herein include a system for measuring an electric potential in the earth, which includes a first sensor. The first sensor includes a sensing plate for placement in an environment in close proximity to the earth. The sensing plate has an operative capacitive coupling with the earth and measures the earth's electric potential. The sensor also includes a barrier providing electrochemical segregation between the sensing plate and the earth and an amplifier having at least one stage for receiving and amplifying a first signal carrying the potential measured by the sensing plate. The sensor also includes a first connection carrying the first signal from the sensing plate to the amplifier; and a reference voltage for application to the first stage of the amplifier, the reference voltage providing a reference against which the potential measured by the sensing plate is compared.

The embodiments of the invention described herein also include an apparatus for measuring electric potentials of the earth for use in geophysical soundings which includes a sensing plate for placement in an environment in close proximity to the earth, the sensing plate having an operative capacitive coupling with the earth and measuring the earth's electric potential. The apparatus also includes a barrier providing electrochemical segregation between the sensing plate and the earth, an amplifier having at least one stage for receiving and amplifying a first signal carrying the potential measured by the sensing plate, a first connection carrying the first signal from the sensing plate to the amplifier; and a reference voltage for application to the first stage of the amplifier, the reference voltage providing a reference against which the potential measured by the sensing plate is compared.

The embodiments of the invention described herein also include a method for making a measurement of the electric potential within the earth including the following steps: placing a sensing plate within a close proximity of the earth but electrochemically segregated from the earth by means of a barrier, the sensing plate making an operative capacitive coupling with the earth, measuring the earth's electric potential using the sensing plate, sending a first signal carrying the potential measured by the sensing plate to an amplifier having at least one stage, comparing the potential measured by the sensing plate to a reference voltage, and amplifying and filtering the first signal.

The embodiments of the invention described herein also include a method for making a measurement of the electric potential within the earth including the steps of placing a sensing plate in an environment in close proximity to the earth to make a capacitive coupling to the earth potential and measure the earth's electric potential, providing a barrier to inhibit an electrochemical reaction of the sensing plate with the earth, wherein a coupling of the barrier and the sensing plate has a resistance greater than 10 k$\Omega$ and a capacitance of the sensing plate greater than 100 nF, sending a first signal carrying the potential measured by the sensing plate to an amplifier having at least one stage, comparing the potential measured by the sensing plate to a reference voltage, amplifying and filtering the first signal; and wherein the difference between the first and second potentials is used to determine one or more electric fields.

The embodiments of the invention described herein also include a method for making a measurement of the electric potential of underground formations within the earth including the steps of placing at least a first sensing plate and a second sensing plate on or within the earth in order to make operative capacitive couplings of the first and second sensing plates with the earth potential, measuring the earth's electric potential with the first and second sensing plates, sending a first signal carrying the first potential measured by the first sensing plate to a first amplifier having at least one stage, sending a second signal carrying the second potential measured by the second sensing plate to a second amplifier having at least one stage, comparing the first potential measured by the first sensing plate to a first reference voltage, comparing the second potential measured by the second sensing plate to a second reference voltage, amplifying and filtering the first signal with the first amplifier, amplifying and filtering the second signal with the second amplifier, connecting outputs of the first and second amplifiers to a data acquisition system, and using the difference between the first and second potentials to determine one or more electric fields.

Other aspects and advantages of the embodiments described herein will become apparent from the following description and the accompanying drawings, illustrating the principles of the embodiments by way of example only.

BRIEF DESCRIPTION OF THE DRAWINGS

Features and advantages of the present invention will become apparent from the appended claims, the following detailed description of one or more example embodiments, and the corresponding figures.

Figure 1:
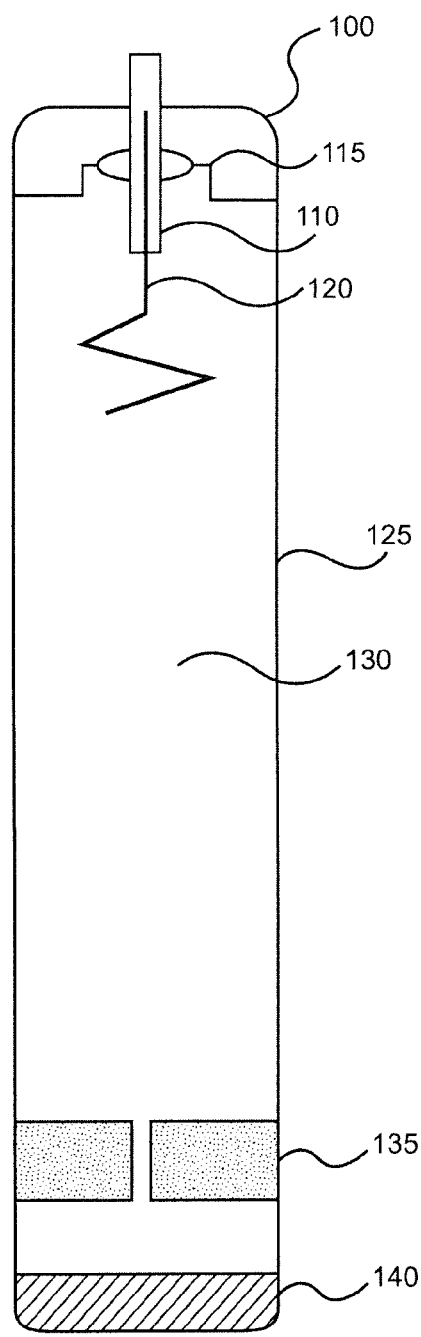
FIG. 1 is a cross sectional view of a metal/metal salt electrode, built according the prior art.

While the invention is subject to various modifications and alternative forms, specific embodiments thereof are shown by way of example in the drawings and the accompanying detailed description. It should be understood, however, that the drawings and detailed description are not intended to limit the invention to the particular embodiments. This disclosure is instead intended to cover all modifications, equivalents, and alternatives falling within the scope of the present invention as defined by the appended claims.

DETAILED DESCRIPTION

The drawing figures are not necessarily to scale and certain features may be shown exaggerated in size or in somewhat generalized or schematic form in the interest of clarity and conciseness. In the description which follows, like parts may be marked throughout the specification and drawing with the same reference numerals. The foregoing description of the figures is provided for a more complete understanding of the drawings. It should be understood, however, that the embodiments are not limited to the precise arrangements and configurations shown. Although the design and use of various embodiments are discussed in detail below, it should be appreciated that the present invention provides many inventive concepts that may be embodied in a wide variety of contexts. The specific aspects and embodiments discussed herein are merely illustrative of ways to make and use the invention, and do not limit the scope of the invention. It would be impossible or impractical to include all of the possible embodiments and contexts of the invention in this disclosure. Upon reading this disclosure, many alternative embodiments of the present invention will be apparent to persons of ordinary skill in the art.

Figure 2:
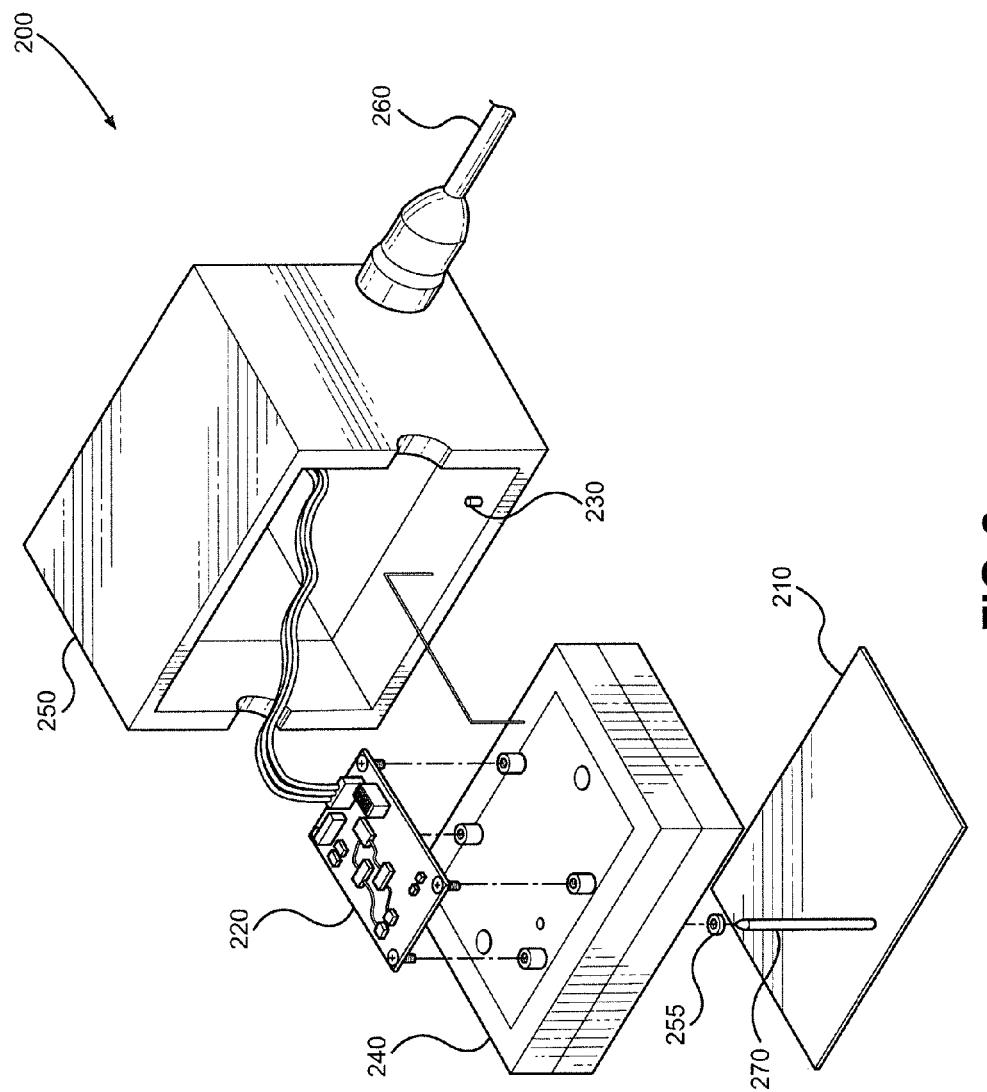
FIG. 2, in accordance with one or more embodiments of the present invention, is a cross sectional schematic of an electric potential sensor.

FIG. 2 is a cross section schematic of a general electric potential sensor, in accordance with one or more embodiments of the present invention. The sensor 200 for measuring the electric potential in the earth comprises a sensing plate 210, and an amplifier 220, preferably integrated into a single, non-conducting housing 250, but this is not essential and the amplifier 220 could be housed in a different enclosure than that housing the sensing plate 210. While weather-proof housing both the sensing plate 210 and the amplifier 220 is preferred, the housing may not be essential in some applications, such as if the sensing plate 210 is buried or if the sensor 200 is only expected to be in place for a short time. The housing should contain an open region or the sensing plate should only be partly encased by the housing, to enable the sensing plate to couple to the potential of interest in the earth.

The sensing plate 210 measures an earth potential signal and transmits the earth potential signal to the amplifier 220 via a first connection 255. The distance between the amplifier 220 and sensing plate 210 should preferably be minimized to reduce stray capacitance between the first connection 255 and the environment. Preferably the first connection 255 is enclosed in a conductor to minimize pickup of environmental interference. Preferably the conductor acts as a guard, wherein its potential is held at or close to the electric potential of the connecting wire by methods known to those skilled in the art. After the signal is amplified and filtered, the signal may pass through the output 260 to a data acquisition system (not depicted in FIG. 2).

The sensing plate 210 may comprise a flat conducting object ranging from 1 square centimeter in area to 100 square centimeters, but is not limited to this size range, does not have to be flat, and does not have to be made of solid material. The sensing plate 210 could take a variety of shapes. The sensing plate 210 may be rigid or can be deformable in order to adapt at least partly to the contours of the earth. For example, within a borehole, the sensing plate 210 could be curved to match the internal diameter of the hole. One or more protrusions or other features may extend from (or form part of) the sensing plate 210 and may be used to mechanically anchor the sensing plate to the earth, if such an anchorage is desired. The protrusions may be of the same material as the sensing plate and are preferably adapted or treated to prevent an electrochemical reaction with the earth. Instead of being solid, the sensing plate 210 may comprise non-solid conducting material, such as a chain mesh. As another alternative, the sensing plate 210 may comprise a thin, flexible metal sheet covering a deformable body, such as a bean bag.

The amplifier 220 may include multiple amplification and filtering stages. The sensor 200 produces an output 260 from the amplifier 220, the output 260 being indicative of the earth potential. The output 260 can be calibrated in a suitable test fixture in order to give an accurate measurement.

Locating the amplifier 220 in close proximity to the sensing plate 210 enables an input impedance of the first stage amplifier to be set to a higher value than would be feasible if the sensing plate and amplifier were separated. A particular benefit of a high input impedance is that the signal that is coupled into the amplifier becomes much less dependent on the coupling capacitance and coupling resistance of the sensing plate to the earth, and much less dependent upon the resistance, $R_e$, of the earth between the sensors. The result of this overall reduced dependence on the electrical properties of the earth is that the performance of the sensor becomes relatively immune to weather conditions. For example, for a sufficiently high amplifier input impedance at the upper end of the frequency range of interest, the value of $R_e$ can change by a factor of 1,000,000 with essentially no measurable change in the signal potential produced at the sensor output. At lower frequency, the range of earth conductivity that produces negligible effect can be even higher.

To measure an electric field, it is necessary to determine the electric potential at two or more points. For example, two points on, or near, the earth's surface provide a measure of the horizontal electric field, where the electric field, E is given by the difference of the two measured potentials, V1, V2, divided by the linear distance, d, between them; i.e. E=(V1−V2)/d. For sites of economic interest, the measurement points are commonly spaced 20 to 100 m, or farther, apart. For convenience, the individual potentials are recorded by a separate data acquisition unit, commonly, but not necessarily, located midway between the points, and their difference calculated via a differential amplifier before the data are digitized. The two points may comprise measurements made by two sensors or may comprise measurements made by one sensor at one point, compared to an adequately reliable reference voltage at the other point that could be provided by a conventionally established means, such as a previously installed deep electrical ground stake for a building.

As discussed further herein, to reduce any stray coupling, a guard 240 may be incorporated into the sensor housing in close proximity to the sensing plate 210 in the manner taught by U.S. Pat. No. 6,961,601 to Matthews et al, entitled "Sensor System for Measuring Biopotentials," issued: Nov. 1, 2005 ("U.S. Pat. No. 6,961,601"). The guard 240 is maintained at, or close to, the potential of the sensing plate 210 via a signal produced by the amplifier 220 in a manner known to those skilled in the art. The guard 240 can be configured as an enclosure that separates the amplifier 220 from the sensing plate 210 as depicted in FIG. 2. To minimize the risk of the guard 240 being connected to the sensor input through the surface of the earth, the guard 220 is preferably enclosed in the non-conducting housing 250. In a preferred operational mode, the sensing plate 210 is located parallel and adjacent to the earth's surface. The sensing plate 210 may be placed directly on the earth's surface, or mounted slightly above the surface, or buried close to the surface of the earth. The surface may be horizontal with respect to gravity, or be part of a slope, or even form the inside surface of a borehole, mine or cave.

The earth may have any electrical conductivity of any normally occurring surface material, ranging from very low conductivity, such as for dry earth, or ice to the highest observed earth conductivities, e.g. a dry salt lake. A principal feature of the sensor design is that the transfer of charge (i.e. electrical conduction) between the sensing plate 210 and the earth can, in the limit, be zero, thereby eliminating the need to provide a defined stable direct current conduction path between the sensing plate and the earth. A given sensor may be optimized in terms of frequency response, cost or some other parameter for one specific type of earth and type of weather where it is intended to be used (e.g. primarily very dry earth or primarily very moist earth) or be intended for use in any type of earth and across all natural weather conditions.

A principal application of the present invention is the collection of data for imaging of earth conductivity profiles using the magnetotelluric (MT) or controlled source electromagnetic (CSEM) methods including but not limited to induced polarization (IP), spectral induced polarization (SIP), electrical resistivity tomography (ERT), and controlled-source audio-magnetotelluric (CSAMT) methods. These applications require sensitivity on the order of 100 nV/√Hz to 10 μV/√Hz over the frequency range 0.1 Hz to 100 Hz, and so it is necessary that the sensor 200 have an internal noise level that is correspondingly low. However, the electric potential sensor is limited neither to these applications nor to the frequency ranges usually employed for these applications.

The sensing plate 210 is arranged to be electrochemically segregated with respect to the earth, yielding what is termed herein as an "operative capacitive coupling" between the sensing plate 210 and the earth. For convenience, the aspect of the sensor 200 that effects the electrochemical segregation, is termed a "barrier" herein. There are several possible approaches to accomplish the electrochemical segregation of the sensing plate 210.

First, the sensing plate 210 may, for example, comprise a conductor, (e.g. a metal, such as copper), coated with a passivation layer that does not chemically react with the earth. Examples of such a coating may include plastic, Teflon® or other chemically non-reactive coating. The barrier in this case would comprise the passivation layer. Alternatively, the sensing plate 210 may be made from a material, including but not limited to aluminum (Al), tantalum (Ta) and titanium (Ti), that can be treated so as to form a protective layer at its outer surface. For example, an oxide layer could be formed on the outer surface of the material. In such a case, the barrier would comprise the protective layer. In both of these cases, it is preferable that the passivation layer or the protective layer be impervious to fluids that are potentially present in the earth. As an alternative barrier, an electrical impedance may be added in series with the sensing plate 210, in order to reduce the current flow between the sensing plate 210 and the earth. Making the added impedance a capacitor 270, as depicted in FIG. 2, has the further advantage of blocking a DC interface potential that may occur between the sensing plate 210 and the earth.

Another approach to creating the barrier is to position the sensing plate 210 at some stand-off from the earth's surface. By using a stand-off as the barrier, there is the further benefit of minimizing the physical contact between potential chemical reactants. If mounted above the surface, the stand-off from the earth that should be used preferably depends on the size of the sensing plate 210, the environmental conditions on site, and the desired measurement sensitivity. For example a 10 cm×10 cm sensing plate 210 might have a stand-off of 1 cm, whereas to achieve approximately the same sensitivity a 1 m×1 m, the sensing plate 210 might have a stand-off of 5 cm. Similarly, if the environment has a high level of electromagnetic noise or static electricity, the stand-off should be reduced to reduce the pick-up of environmental interference. Generally the sensitivity will be improved the closer the sensing plate 210 is to the ground. In particular the sensing plate 210 should be close enough to the ground that its capacitance to the ground is at least equal to twice its self-capacitance, which is two times its value to free space.

As another way to effect the barrier to electrochemically segregate the sensing plate 210 from the earth, the sensing plate 210 may be made entirely from a material that is adequately chemically inert in the intended environmental conditions, including but not limited to, graphite, carbon fiber, titanium, or stainless steel. In this case, the character of the chemically inert material provides the barrier.

In some cases, it may be desirable to include multiple barriers, that is, incorporating multiple methods of reducing electrochemical reactions of the sensing plate 210 with the earth. In all cases it is understood that one or more barriers are deliberately added to the sensor 200 as part of its design and manufacture.

The one or more protrusions previously mentioned may have a beneficial effect by increasing the coupling capacitance of the sensing plate with respect to the earth. The protrusions generally should not be too long or too large in diameter, if they are to be pressed into the earth manually, but this may depend on conditions at the site.

If desired, one or more sensing plates 210 may be buried, for example to protect the sensor from damage or theft, or to measure potentials deeper within the earth. Similarly, the entire sensor 200 could be buried.

Referring again to FIG. 2, to reduce the pickup of EMI and dust noise within the sensor itself, an electrostatic shield, 230, is, preferably, integrated into the housing 250. The electrostatic shield, 230 may be connected to an electrical ground point of the sensor circuit, or may be driven as a guard at, or near, the potential of the sensor input. As with the housing, the shield should contain an open region to enable the sensing plate to couple to the potential of interest in the earth.

Figure 3:
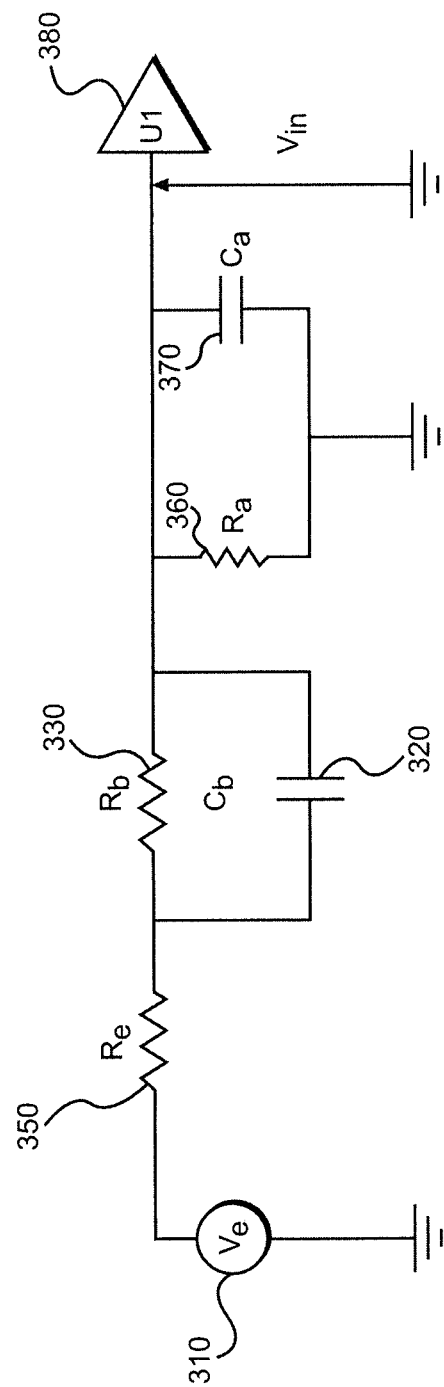
FIG. 3 is a schematic of an input measurement circuit showing the key circuit elements, in accordance with one or more embodiments of the present invention.

FIG. 3 is a schematic of an equivalent circuit for a sensor, in accordance with one or more embodiments of the present invention. The potential of the earth is represented by a voltage source, $V_e$, 310. The sensing plate 210, couples to the potential $V_e$ 310 via the barrier, a relationship which may be represented by circuit elements: a first capacitor $C_b$, 320, and a first resistor $R_b$, 330, in parallel. The values of $C_b$ and $R_b$ are determined by the properties of the barrier and the contact capacitance and resistance of the barrier with the earth. The combination of $C_b$ 320 and $R_b$ 330 represents the coupling impedance between the sensing plate and the earth. The bulk resistance of the sensing plate 210 is also included in the value of $R_b$. The "operative capacitive coupling" between the sensing plate 210 of the present invention and the earth, created by the barrier which provides electrochemical segregation of the sensing plate 210 with respect to the earth, results in and is defined by values of $R_b > 10$ k$\Omega$ and $C_b > 2000$ pF over the entire operating frequency range of the sensor.

Continuing to refer to FIG. 3, a second resistor $R_e$, 350, represents the bulk resistance of the earth that is present between two points at which the electric potential is to be measured. If one uses two identical sensors 200 located at two points, $R_e$ 350 in FIG. 3 may be defined as half the bulk resistance between the measurements at the two points. A third resistor Ra, 360, and second capacitor Ca, 370, represent the input impedance of the first stage of the amplifier 220, which is depicted in FIG. 3 as U1, 380.

It is known to those skilled in the art that a conductor in contact with a conducting medium, such as the earth's surface, or seawater, can be represented by a range of circuit models, for example Randle's circuit or the Warburg impedance. These various models are chosen to best represent the variation with frequency of the electrical coupling to the medium. It is also well known in electrical circuit theory that at a given frequency, any combination of series and parallel electrical resistors and capacitors can be represented by a single equivalent resistor and capacitor in parallel. The combination of $C_b$ 320 and $R_b$ 330 in parallel given in FIG. 3 represents such a reduced form of a more complex coupling model, wherein the specific values of $C_b$ 320 and $R_b$ 330 are calculated at a particular frequency of interest. Similarly, any blocking impedance that is added in series with the sensing plate 210 and the impedance to the earth and any protrusions added to the sensing plate 210 can be included in the equivalent value of $R_b$ 330 and $C_b$ 320, at a given frequency. In determining the specific values of $C_b$ 320 and $R_b$ 330, the frequency is taken to be one or more values within the operating frequency range of the sensor 200. For example, if the sensor 200 is used over the frequency range 0.1 Hz to 100 Hz, the equivalent values of $C_b$ 320 and $R_b$ 330 might be calculated at the end of the range (i.e. at 0.1 Hz and 100 Hz), at or near the midpoint of the range (e.g. 3 Hz) or at discrete chosen values (e.g. 0.5 Hz, 5 Hz, 50 Hz). The number of discrete values chosen depends on the desired accuracy and the variability of the values over the range.

The values of $C_b$ 320 and $R_b$ 330 depend on the size of the sensing plate 210, and the protrusions of the sensing plate 210, if any, as well the nature of the environment in which the sensor is placed. In addition to the bulk physical properties of the material used for the barrier, $C_b$ 320 and $R_b$ 330 also depend upon composition and water content of the earth in the immediate vicinity of the sensing plate 210, both of which can vary considerably, especially during a long duration measurement. In the limiting case of a perfect barrier material, $R_b$ 330 is infinite, and the coupling between the sensing plate 210 and the earth is entirely capacitive. However, in practice, no material will have infinite internal resistance or infinite contact resistance to the earth, and it is the intent of the invention that $C_b$ 320 and $R_b$ 330 be set at a level that is necessary and cost effective for a given application, considering the desired duration of monitoring and chemical conditions in the earth.

In many cases, Rb 330 will be finite and will provide a path to ground for electrical current at the amplifier input. For some applications, it is preferable that the sensor 200 be designed so that it operates normally within a range with $R_b$ 330 being effectively infinite. This raises a problem however because, with $R_b$ 330 effectively infinite (and therefore acting like an open circuit), there is no resistive path to ground at the input to carry the amplifier input bias current. As a result the amplifier input bias current flows onto the sensing plate capacitance $C_b$ 320, thus increasing voltage at the amplifier input until it saturates. There is a challenge to provide a resistive path to earth at the amplifier input without essentially shorting the amplifier 220 itself. Methods to provide such a path are taught in U.S. Pat. No. 6,686,800 to M. A. Krupka, entitled "Low Noise, Electric Field Sensor," issued Feb. 3, 2004. A feedback circuit (not depicted in FIG. 3) provides a relatively low impedance path at direct current, while increasing the effective amplifier input impedance to more than 100 times greater than the maximum value of the series combination of $R_e$ and the sensing plate coupling impedance in the bandwidth of interest.

In the limit that the sensing plate 210 is predominantly a capacitor, the amplifier should preferably be designed to limit its input noise current, $I_n$. In the predominantly capacitive limit, the amplifier input noise current acts entirely on the sensing plate capacitance $C_b$ 320, producing a voltage noise given by $I_n/\omega C$, in which the angular frequency $\omega$ is $2\pi$ times the frequency of interest. For achievable amplifier designs and for frequencies of interest in geophysics, the amplifier noise current imposes a lower limit that $C_b$ 320 should preferably be greater than 100 pF and more preferably greater than 1 nF.

A particular advantage of having a high input impedance for the first stage of the amplifier 220 is that the overall transfer function from the potential within the earth to the sensing plate to the output of the first stage amplifier can be much less dependent on changes in the electrical properties of the earth and the electrical coupling between the sensing plate and the earth. In contrast, if an electrochemical electrode such as in the prior art, is sited on the earth and it rains, thereby changing the earth conductivity dramatically, there can be a significant change in the recorded signal amplitude and signal phase. Similarly, if over time the earth becomes more compact, the capacitive coupling between the earth and the sensing plate 210 can increase. For a capacitive sensing system built with a conventional low impedance amplifier, such a change would similarly affect recorded signal amplitude and signal phase. The combination of the sensing plate 210 and high impedance amplifier 220 should preferably be arranged so that the transfer function is effectively unchanged over the expected variation in earth conductivity.

For the circuit shown in FIG. 3, the input transfer function (TF), the ratio of the voltage, $V_{in}$, presented at the input of the first stage amplifier to the earth potential signal, $V_e$, is given by Equation 2:

$$TF = \frac{V_{in}}{V_e} = \frac{R_a(1 + j\omega C_b R_b)}{(1 + j\omega C_a R_a)(R_e + R_b + j\omega C_b R_e R_b) + R_a(1 + j\omega C_b R_b)} \quad [2]$$

In the limit that $R_b \Rightarrow \infty$, the TF becomes:

$$TF = \frac{(j\omega C_b R_a)}{(1 + j\omega C_a R_a)(1 + j\omega C_b R_e) + (j\omega C_b R_a)} \quad [3]$$

At frequencies above ~1 Hz, a high impedance amplifier can easily be designed with a large value of $R_a$ such that $\omega C_b R_a \gg 1$, and $C_a$ such that $C_a \ll C_b$, then, Equation 3 can be simplified to:

$$TF = \frac{1}{(1 + j\omega C_a R_e)} \quad [4]$$

In this case, the TF is essentially independent of $R_e$ until $\omega C_a R_e \gtrsim 0.01$. Accordingly the first stage amplifier should be designed so that $C_a$ is small, preferably less than 5 pF, and more preferably less than 2 pF, in order to accommodate as large a range of $R_e$ as is possible without affecting the TF.

In the limit $R_b \gg R_e$, Equation 2 can be simplified to:

$$TF = \frac{(1 + j\omega C_b R_b)}{\frac{R_b}{R_a}(1 + j\omega C_a R_a)(1 + j\omega C_b R_e)(1 + j\omega C_b R_b)} \quad [5]$$

In the high frequency regime, $\omega C_b R_b \gg 1$, and with the amplifier again designed such that $C_a \ll C_b$ and $R_a \gg R_b$ this can be further simplified to:

$$TF = \frac{1}{\left(1 + \frac{R_e}{R_a} + j\omega C_a R_e\right)} \quad [6]$$

Even for the most resistive earth, it is easy to arrange $R_a \gg R_e$ and so Equation 6 becomes a close approximation of Equation 4. Thus, provided the system is designed such that $R_a$ is much larger than $R_b$ and $R_e$, the system has the same response at high frequency as in the limit $R_b$ approaches infinity. The regime in which $R_b \geq 100/(\omega C_b)$ is referred to herein as the Strong Capacitive regime.

However, it is not essential that $R_b$ be large in order to build an electric field sensor according to the present invention. The case of $R_b$ being very low, for example less than 100Ω, corresponds to the current geophysical practice and is achieved where needed by the methods described above. The presently used standard for $R_a$ is on the order of 1 MΩ. Accordingly, setting $R_b < R_e$ and $\omega C_b R_b \Rightarrow 0$ in the conventional case, the TF from Equation 2 becomes:

$$TF = \frac{(1 + j\omega C_b R_b)}{\frac{R_b}{R_a}(1 + j\omega C_a R_a)(1 + j\omega C_b R_b) + (1 + j\omega C_b R_b)} = \frac{1}{\frac{R_e}{R_a}(1 + j\omega C_a R_a) + 1} \quad [7]$$

Equation 7 describes the TF for the prior art case of low $R_b$. It is identical to Equation 6 which describes the high frequency Strong Capacitive regime. Thus, even though $R_b > R_e$ in the Strong Capacitive case, provided $R_a > R_b$, the Strong Capacitive regime of a earth sensor built according to the present invention has the same form of TF at high frequency, given in Equation 6, as the TF, given in Equation 7, for the prior art case of low $R_b$.

The current practice in geophysics is limited at $R_e < 100\,\text{k}\Omega$, and works acceptably for $R_e < 10\,\text{k}\Omega$. In this regime the first term in the denominator in the right hand expression of Equation 7 is small, and the TF approximates the desirable case of having gain=1, and of having negligible frequency dependence. However, at increased $R_e$ the gain and phase of the TF deviate from one and zero respectively by an amount determined by the properties of the amplifier.

Consider a case in which $R_b$ is neither very large, as in the Strong Capacitive regime, nor made very small through the methods practiced in the prior art. A relevant case of considerable scientific and commercial interest is the case when both $R_b$ and $R_e$ are large. If both $R_b$ and $R_e$ are large and $R_b \gg R_e$, we have the result given in Equations 5 and 6. For the remaining case when both $R_b$ and $R_e$ are large and approximately equal, the TF can be written:

$$TF = \frac{R_a(1 + j\omega C_b R_b)}{R_e(1 + j\omega C_a R_a)(\sim 2 + j\omega C_b R_b) + R_a(1 + j\omega C_b R_b)} \quad [8]$$

In the event that $C_b$ is made large (e.g. $C_b > 1\,\mu\text{F}$) and the frequency of interest is sufficient (e.g., >10 Hz), the term $\omega C_b R_b \gg 1$ and Equation 8 can be written:

$$TF = \frac{R_a}{R_e(1 + j\omega C_a R_a) + R_a} = \frac{1}{\frac{R_e}{R_a} + (1 + j\omega C_a R_e)} \sim \frac{1}{(1 + j\omega C_a R_e)} \quad [9]$$

where the last expression holds for $R_e \ll R_a$. However, in the case that $C_b$ and/or $\omega$ is/are small so that $\omega C_b R_b \ll 1$, Equation 8 can be simplified to the form in Equation 10, which again gives the same approximate form as Equations 4, 7 and 9:

$$TF = \frac{R_a}{2R_e(1 + j\omega C_a R_a) + R_a} = \frac{1}{\frac{2R_e}{R_a} + (1 + 2j\omega C_a R_e)} \sim \frac{1}{(1 + 2j\omega C_a R_e)} \quad [10]$$

where the last expression holds for $R_e \ll R_a$. Further, in the intermediate case $\omega C_b R_b \sim 1$, the TF in Equation 8 can be approximated to unity in practical cases because the terms multiplied by $R_a$ strongly dominate the term multiplied by $R_e$.

Thus, in the limit of moderate $R_b$ (i.e. $R_b \sim R_e$) for large $R_a$, the TF again depends in its high frequency limit only on the product of $C_a$ and $R_e$. The case of moderate $R_b$ is referred to herein as the Weak Capacitive regime. Equations 6 and 9 show that in the high frequency limit, the Weak and Strong Capacitive regimes have an identical dependence on the properties of the earth.

At low frequency in the Strong Capacitive regime, $R_b$ is always much larger than $1/(\omega_b)$ and the system response is generally dominated by the product of $C_b$ and $R_a$, i.e. the numerator in Equation 3. Specifically, the larger the value of $C_b$, the smaller the frequency dependent change in the TF. In the Weak Capacitive regime, the TF has the favorable property that at low frequency it is approximated by the expression given in Equation 12.

$$TF = \frac{R_a}{2R_e(1 + j\omega C_a R_a) + R_a} \sim \frac{R_a}{2R_e + R_a} \sim 1 \quad [12]$$

The behavior of the TF in the Weak and Strong Capacitive regimes at low and high frequencies is summarized in Table 1.

TABLE 1

Summary of the Two Regimes of Earth Potential Sensor Behavior

| Capacitive Regime | Low Frequency Response | High Frequency Response |
|---|---|---|
| Weak | $\sim 1$ | $\frac{1}{(1 + j\omega C_a R_e)}$ |
| Strong | $\propto C_b R_a$ | $\frac{1}{(1 + j\omega C_a R_e)}$ |

In all cases the goal of applying the capacitive coupling is to provide a sensor that can measure electric potentials within the earth with a gain and phase response that has a negligible dependence on the electrical resistance of the earth between the electrodes.

Figure 4:
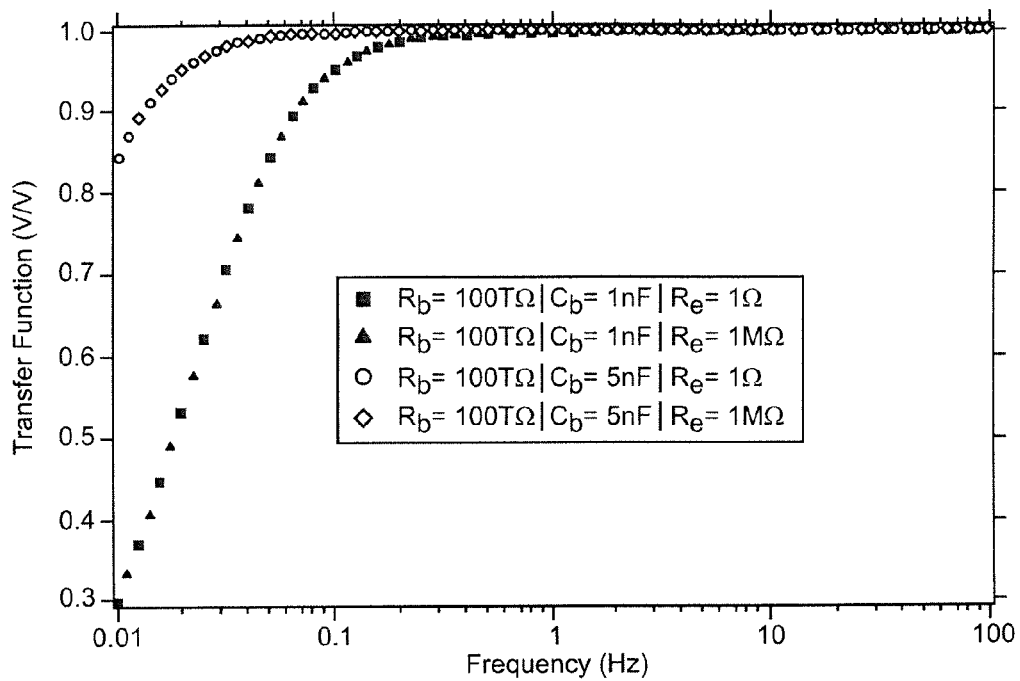
FIG. 4, in accordance with one or more embodiments of the present invention, is a depiction of Transfer Function (V/V) vs. Frequency (Hz) in a Strong Capacitive Regime for $R_e$ varying from 1Ω to 1 MΩ, with $R_b$ equal to 100 TΩ and $C_b$ set to either 5 nF or 1 nF.
Figure 5:
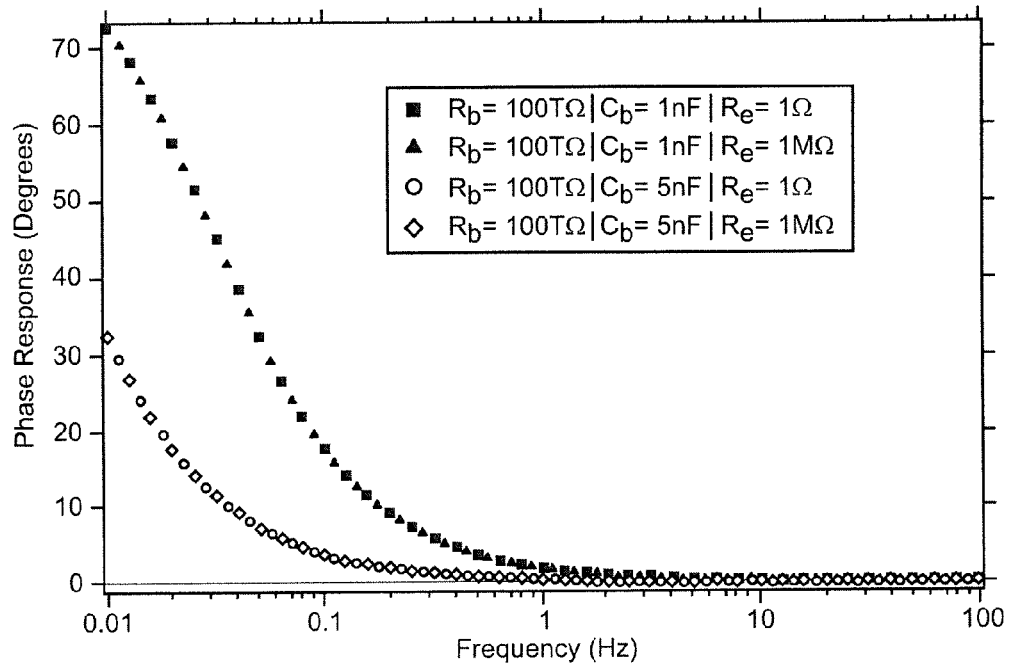
FIG. 5, in accordance with one or more embodiments of the present invention, is a depiction of Sensor Phase Response (Degrees) vs. Frequency (Hz) in a Strong Capacitive Regime for $R_e$ varying from 1Ω to 1 MΩ, with $R_b$ equal to 100 TΩ and $C_b$ set to either 5 nF or 1 nF.

FIGS. 4 and 5 depict graphs of analytic simulations of the output for the sensor circuit shown in FIG. 3 to a constant signal present within the earth for earth resistance values of 1 Ω and 1 MΩ, and reflect the Strong Capacitive Regime. FIG. 5, in accordance with one or more embodiments of the present invention, is a depiction of Transfer Function (V/V) vs. Frequency (Hz) in a Strong Capacitive Regime for $R_e$ varying from 1 Ω to 1 MΩ, with $R_b$ equal to 100 TΩ and $C_b$ set to either 5 nF or 1 nF. Similarly, FIG. 5, in accordance with one or more embodiments of the present invention, is a depiction of Sensor Phase Response (Degrees) vs. Frequency (Hz) in a Strong Capacitive Regime for $R_e$ varying from 1 Ω to 1 MΩ, with $R_b$ equal to 100 TΩ and $C_b$ set to either 5 nF or 1 nF.

In all cases the goal of applying the operative capacitive coupling is to provide a sensor that can measure electric potentials within the earth with a gain and phase response that has a negligible dependence on the electrical resistance of the earth between the electrodes. Results for $C_b = 1$ nF and $C_b = 5$ nF are shown for two examples of the Strong Capacitive Regime. The sensor output amplitude and phase, shown in FIG. 4 and FIG. 5 respectively, are unaffected by the very large range of earth electrical resistance, $R_e$. At frequencies below 1 Hz, the dependence of phase with $C_b$ is evident.

Figure 6:
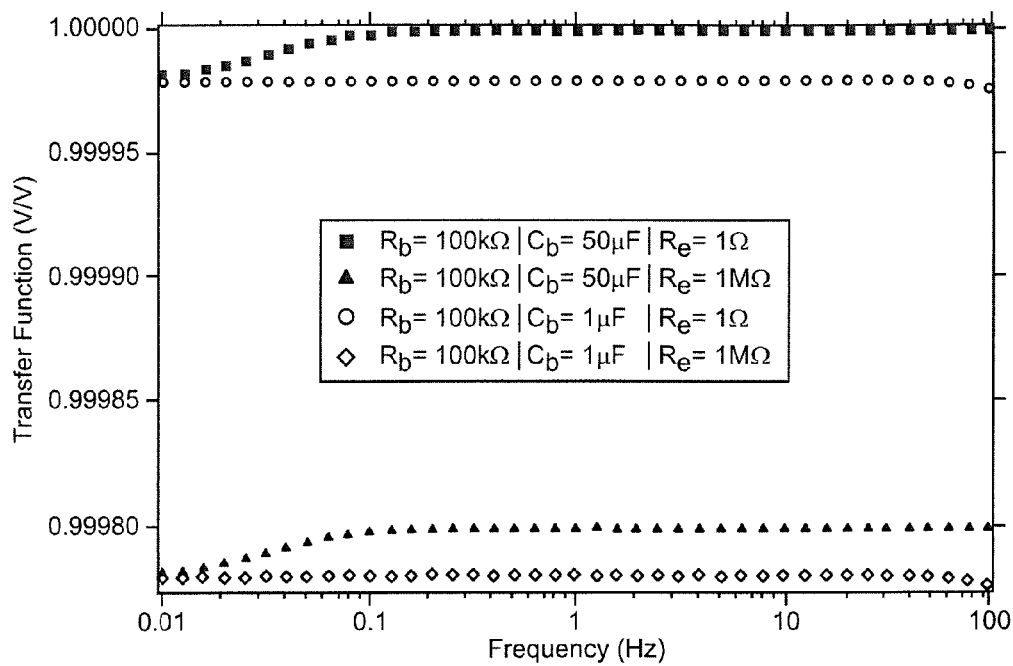
FIG. 6, in accordance with one or more embodiments of the present invention, is a depiction of Transfer Function (V/V) vs. Frequency (Hz) in the Weak Capacitive Regime for $R_e$ varying from 1Ω to 1 MΩ, with $R_b$ equal to 100 kΩ and $C_b$ set to either 50 μF or 1 nF.
Figure 7:
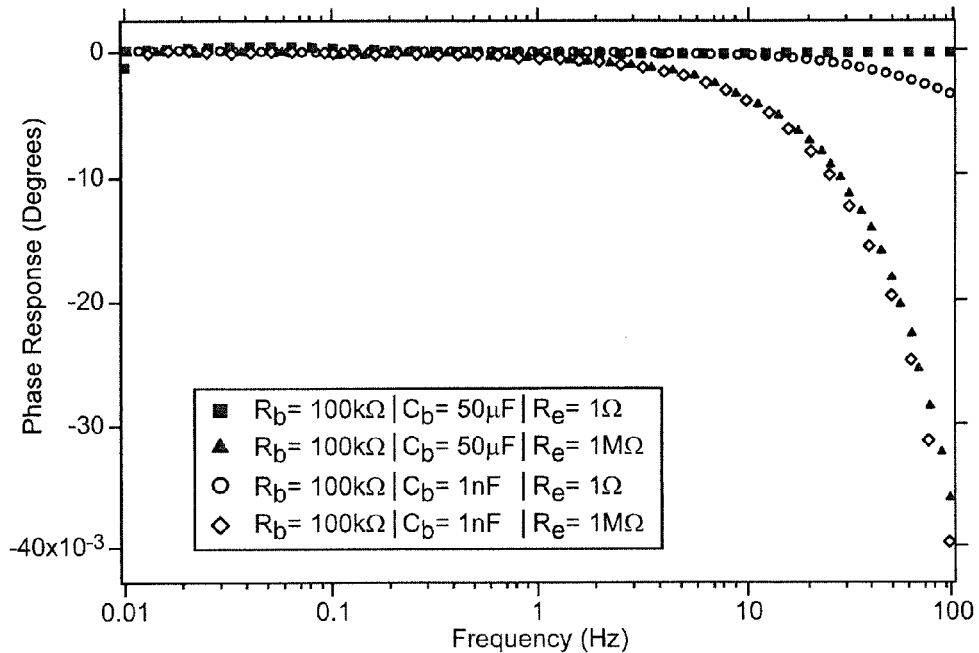
FIG. 7, in accordance with one or more embodiments of the present invention, is a depiction of Sensor Phase Response (Degrees) vs. Frequency (Hz) in the Weak Capacitive Regime for $R_e$ varying from 1Ω to 1 MΩ, with $R_b$ equal to 100 kΩ, and $C_b$ set to either 50 μF or 1 nF.

FIGS. 6 and 7 depict graphs of analytic simulations of the output for the sensor circuit shown in FIG. 3 to a constant signal present within the earth for earth resistance values of 1 Ω and 10 MΩ, and reflect the Weak Capacitive Regime. FIG. 6, in accordance with one or more embodiments of the present invention, is a depiction of Transfer Function (V/V) vs. Frequency (Hz) in the Weak Capacitive Regime for $R_e$ varying from 1 Ω to 1 MΩ, with $R_b$ equal to 100 kΩ and $C_b$ set to either 50 μF or 1 nF. FIG. 7, in accordance with one or more embodiments of the present invention, is a depiction of Sensor Phase Response (Degrees) vs. Frequency (Hz) in the Weak Capacitive Regime for $R_e$ varying from 1 Ω to 1 MΩ, with $R_b$ equal to 100 kΩ, and $C_b$ set to either 50 μF or 1 nF. FIGS. 6 and 7 show the same range of earth resistance for examples of the Weak Capacitive regime, in which $C_b = 1$ nF and 50 μF. The invariance with the variation of earth resistance is apparent.

Figure 8:
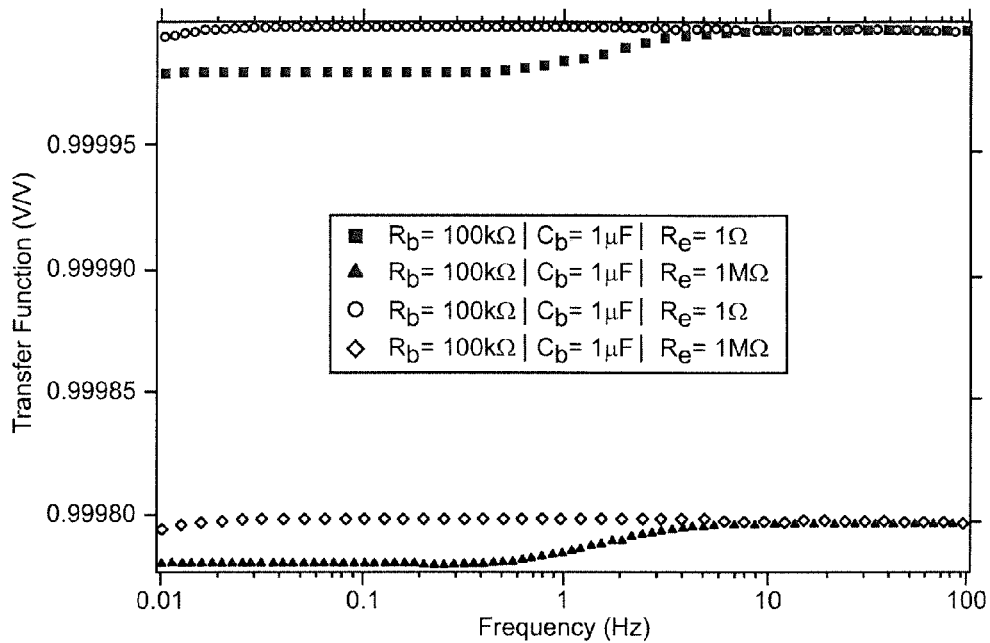
FIG. 8, in accordance with one or more embodiments of the present invention, is a depiction of Transfer Function (V/V) vs. Frequency (Hz) for $R_e$ varying from 1Ω to 1 MΩ, and $C_b$=1 μF, $R_b$ alternating between 100 kΩ and 100 TΩ.
Figure 9:
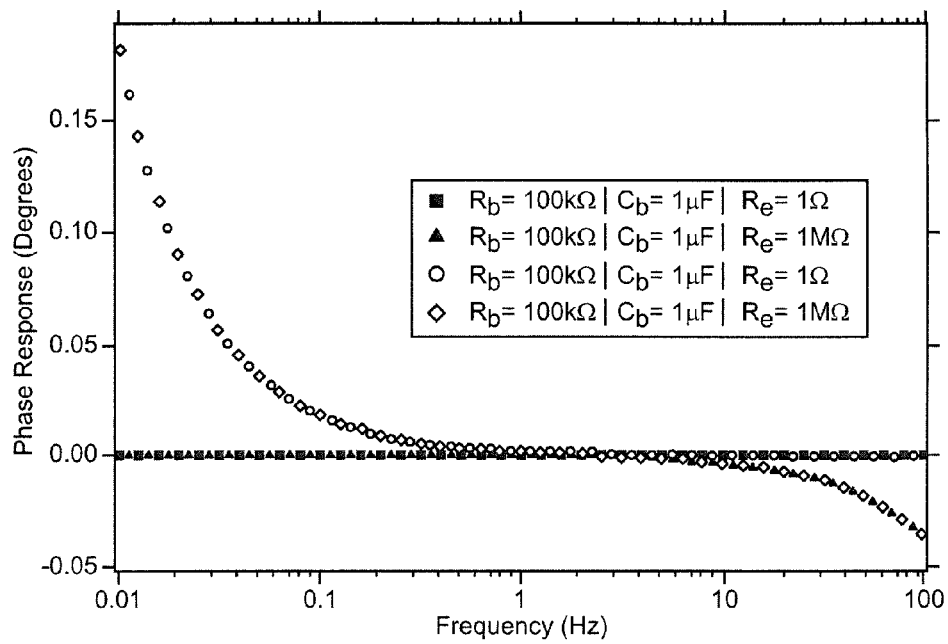
FIG. 9, in accordance with one or more embodiments of the present invention, is a depiction of Sensor Phase Response (Degrees) vs. Frequency (Hz) for $R_e$ varying from 1Ω to 1 MΩ, with $C_b$ set equal to 1 μF and $R_b$ alternating between 100 kΩ and 100 TΩ.

FIGS. 8 and 9 depict graphs of analytic simulations of the output for the sensor circuit shown in FIG. 3 to a constant signal present within the earth for earth resistance values of 1 Ω and 10 MΩ. FIG. 8, in accordance with one or more embodiments of the present invention, is a depiction of Transfer Function (V/V) vs. Frequency (Hz) for $R_e$ varying from 1 Ω to 1 MΩ, and $C_b = 1$ μF and $R_b$ alternating between 100 kΩ and 100 TΩ. FIG. 9, in accordance with one or more embodiments of the present invention, is a depiction of Sensor Phase Response (Degrees) vs. Frequency (Hz) for $R_e$ varying from 1 Ω to 1 MΩ, with $C_b$ set equal to 1 μF and $R_b$ alternating between 100 kΩ and 100 TΩ. For convenience, FIGS. 8 and 9 compare the response with frequency between sensors that operate in the Weak and Strong Capacitive Regimes.

As seen from the plots in FIGS. 4 to 9, a sensor 200 built according to one or more embodiments of the present invention can have a value of $R_b$ equal to or greater than the earth resistance, $R_e$, and still have a Transfer Function that is essentially independent of $R_e$ over a range of 1,000,000. As discussed, the desired value of $R_b$ may be achieved by a variety of methods, and the sensor 200 may require different materials and/or barriers on the sensing plate 210 to accommodate different types of earth. If desired, more than one form of electrochemical segregation may be used in some instances. Regardless of the specific method used to produce $C_b$ and $R_b$, and regardless of whether the sensor 200 operates in the Weak or Strong Capacitive regimes, the sensor 200 performs as intended when the barrier electrochemically segregates the sensing plate 210 from the earth, and the sensing plate 210 has the operative capacitive coupling to the earth.

In both the Weak and the Strong Capacitive regimes, the high frequency performance of the sensor 200 is made less dependent on $R_e$ as the value of $C_a$ becomes smaller. For a compact sensor, the value of $C_a$ can be dominated by stray capacitance between the sensing plate 210 and an input circuit traces to the first stage of the amplifier 220. As previously mentioned, the guard 240 can be incorporated into the sensor housing 250 in close proximity to the amplifier 220 and sensing plate 210, in the manner taught by U.S. Pat. No. 6,961,601 to reduce the stray coupling. The guard 240 is maintained at, or close to, the potential of the sensing plate via a signal produced by the amplifier in a manner known to those skilled in the art. In addition, capacitance neutralization methods and elements can be incorporated into the amplifier 220 in the manner known to those skilled in the art in order to reduce the effective value of Ca.

Figure 10:
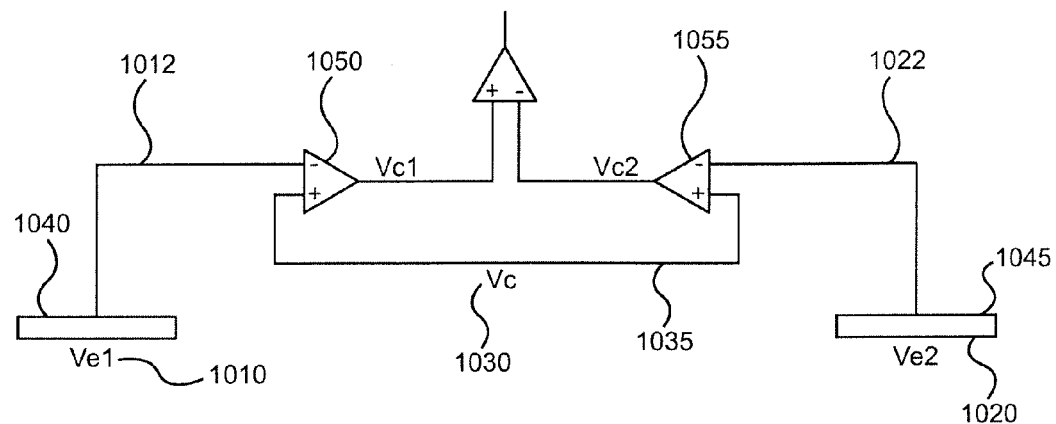
FIG. 10 is a schematic of a sensor circuit, in accordance with one or more embodiments of the present invention, illustrating the role of a reference voltage.

FIG. 10 is a schematic of a circuit of the sensor illustrating the role of a reference voltage 1030, in accordance with one or more embodiments of the present invention. In order for the first stage of the amplifier to operate correctly, it is necessary for the reference voltage, $V_c$ 1030, to be provided. The reference voltage, $V_c$ 1030 should be carried on a separate wire 1035, from the first connections 1012, 1022 that carry the output signals of the sensing plates, 1040, 1045, two of which are depicted as being used in FIG. 10. The reference voltage, $V_c$ 1030 provides the reference against which measured potentials $V_{e1}$ 1010, and $V_{e2}$ 1020, are measured and amplified. Within the required measurement accuracy, reference voltage $V_c$ 1030 must be the same at each of the pair of amplifiers 1050, 1055 in order that the electric field can be correctly determined from the difference of their output voltages. Preferably Vc 1030 is provided by a common wire connected to the both sensors, but in some measurement sites might be provided by a conventional ground stake. If multiple sensors are deployed at the same location, a common reference voltage that is the same for all sensors may be used. In one or more embodiments of the present invention, the common wire is not held at any specific potential but is allowed to float. Alternatively, the common wire can be connected to the ground point of the data acquisition system. In another embodiment, within the sensor the mid-point of its power rails can be tied to the reference voltage in order to provide a local circuit ground. In addition, the reference voltage can be used as one of the voltage inputs within the amplifier chain. Preferably, the reference voltage forms one input to each first stage of the amplifier 1050, 1055, the other input coming from the sensing plates, 1040, 1045, as depicted in FIG. 10.

Amplifying the signal within the sensor 200 enables the output impedance of the sensor 200 to be set to a low, constant value that is independent of the coupling impedance between the sensor 200 and the earth. In one embodiment, this has the benefit that the input impedance of the data acquisition system can be set to a low value, for example 1 kΩ, thereby reducing the pickup of EMI and voltage transients due to dust noise in the cable connecting it to the sensor. In another embodiment, to reduce further contamination of the signal within the cable by EMI and dust noise, the output impedance of the sensor 200 can be set to be much lower than the input impedance of the data acquisition system. In this configuration the sensor output impedance acts to short the noise and transients away from the input of the data acquisition system.

Figure 11:
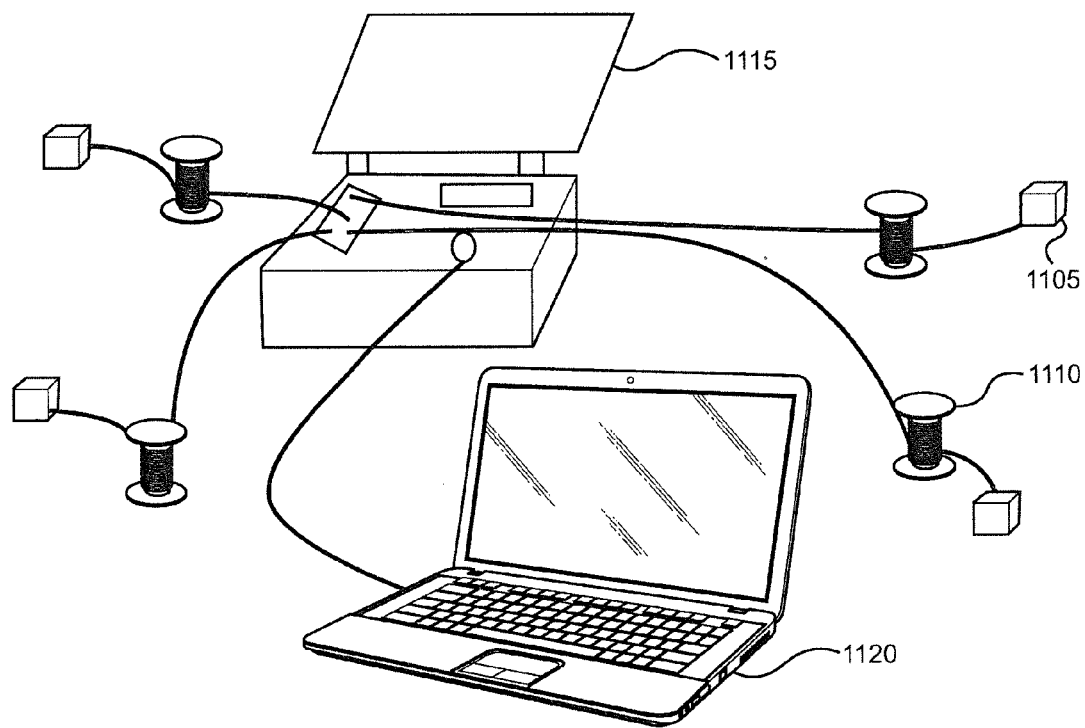
FIG. 11 is diagram of a measurement system which includes four electric potential sensors, in accordance with one or more embodiments of the present invention.

FIG. 11 is a diagram of a measurement system 1100 which includes four electric potential sensors 1105 and which is built according with one or more embodiments of the present invention. The sensors 1105 are each similar in construction to the sensor 200 of FIG. 2. Four spools 1110 contain wire used to connect the output of each sensor 1105 to a data acquisition system (which appears as a lidded box) 1115. The data acquisition system 1115 can store and/or analyze the measurements taken by the sensors and can convey the data to other systems, such as the laptop computer 1120 of FIG. 11. The data can be transmitted from the data acquisition system via cables (as depicted with respect to the laptop 1120 in FIG. 11) or wirelessly or may be made available for secure downloads on demand. Data can be displayed on the screen of the laptop computer 1120. The voltage difference between the sensor outputs may be determined by the data acquisition system.

Figure 12:
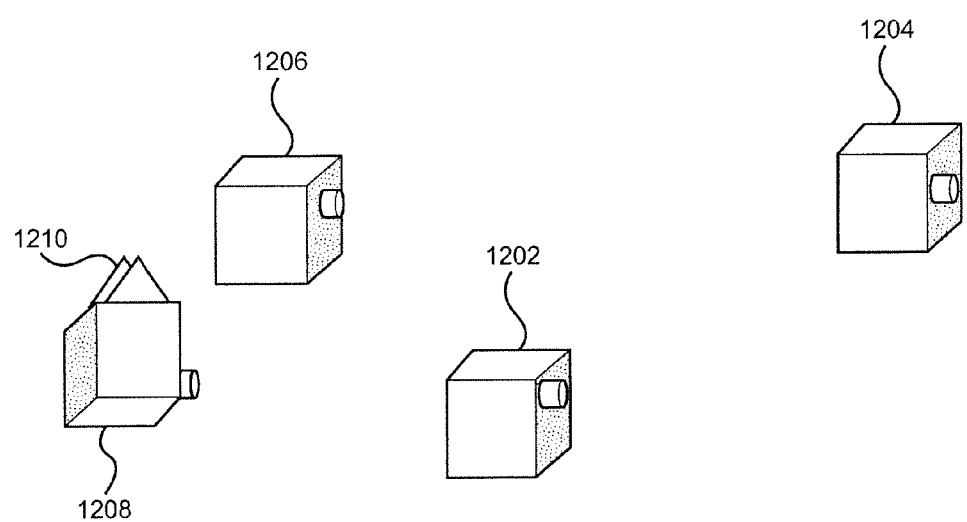
FIG. 12 is a diagram of four electric potential sensors built in accordance with one or more embodiments of the present invention, with one sensor having two spikes.

FIG. 12 is a view of four of prototype electric potential sensors 1202, 1204, 1206, 1208 built in accordance with an embodiment of the present invention. Three of the sensors 1202, 1204, 1206 have plat sensing plates, while one sensor 1208 has two spikes 1210 on (or as a part of) its sensing plate.

In light of the principles and example embodiments described and illustrated herein, it will be recognized that the example embodiments can be modified in arrangement and detail without departing from such principles. Also, the foregoing discussion has focused on particular embodiments, but other configurations are contemplated. In particular, even though expressions such as "in one embodiment," "in another embodiment," or the like are used herein, these phrases are meant to generally reference embodiment possibilities, and are not intended to limit the invention to particular embodiment configurations. As used herein, these terms may reference the same or different embodiments that are combinable into other embodiments.

Similarly, although example processes have been described with regard to particular operations performed in a particular sequence, numerous modifications could be applied to those processes to derive numerous alternative embodiments of the present invention. For example, alternative embodiments may include processes that use fewer than all of the disclosed operations, processes that use additional operations, and processes in which the individual operations disclosed herein are combined, subdivided, rearranged, or otherwise altered.

This disclosure also described various benefits and advantages that may be provided by various embodiments. One, some, all, or different benefits or advantages may be provided by different embodiments.

In view of the wide variety of useful permutations that may be readily derived from the example embodiments described herein, this detailed description is intended to be illustrative only, and should not be taken as limiting the scope of the invention. What is claimed as the invention, therefore, are all implementations that come within the scope of the following claims, and all equivalents to such implementations.

What is claimed is:

1. A system for measuring an electric potential in the earth, comprising:
    a first sensor, comprising:
    a sensing plate for placement in an environment in close proximity to the earth, the sensing plate having operative capacitive coupling with the earth and measuring the earth's electric potential,
    a barrier providing electrochemical segregation between the sensing plate and the earth;
    an amplifier having at least one stage for receiving and amplifying a first signal carrying the potential measured by the sensing plate;
    a first connection carrying the first signal from the sensing plate to the amplifier; and
    a reference voltage for application to the first stage of the amplifier, the reference voltage providing a reference against which the potential measured by the sensing plate is compared.

2. The system of claim 1, wherein the barrier is provided by the character of one or more materials that the sensing plate is made of, the one or more materials being non-reactive with the earth's surface.

3. The system of claim 2, wherein the material the sensing plate is made of is selected from a group consisting of graphite, carbon fiber, titanium, or stainless steel.

4. The system of claim 1, wherein the barrier comprises a protective layer formed by treatment of the sensing plate's surface.

5. The system of claim 4, wherein the sensing plate is made of material selected from a group consisting of aluminum, tantalum, or titanium.

6. The system of claim 1, wherein the barrier comprises a stand-off for physically separating the sensing plate from the earth, in the proximity of which the sensing plate will be placed.

7. The system of claim 1, wherein the barrier comprises an electrical impedance placed in series with the sensing plate.

8. The system of claim 7, wherein the electrical impedance comprises a capacitor.

9. The system of claim 1, further comprising a feedback circuit to provide a resistive path to earth at the input of the amplifier to carry the amplifier input bias current.

10. The system of claim 1, further comprising a non-conductive housing partly encasing the sensing plate.

11. The system of claim 10, wherein the non-conductive housing also encases the amplifier.

12. The system of claim 10, further comprising an electrostatic shield integrated into the non-conductive housing.

13. The system of claim 1, further comprising a guard for reducing stray electrical coupling between the amplifier and the sensing plate, wherein the guard, the amplifier and the sensing plate are situated within a non-conductive housing, with the guard positioned between the amplifier and the sensing plate.

14. The system of claim 1, further comprising a second sensor, comprising:
   a second sensing plate for placement in an environment in substantially the same close proximity to the earth as the first sensor, the second sensing plate having operative capacitive coupling with the earth and measuring the earth's electric potential, a barrier providing electrochemical segregation between the second sensing plate and the earth;
   a second amplifier having at least one stage for receiving and amplifying a second signal carrying the potential measured by the second sensing plate;
   a second connection carrying the second signal from the second sensing plate to the second amplifier; and
   wherein the reference voltage is connected to the first sensor and the second sensor.

15. The system of claim 1, wherein the sensing plate has a protrusion that can anchor the sensing plate to the earth.

16. The system of claim 15, wherein the protrusion comprises a spike.

17. The system of claim 16, wherein the spike is less than 5 cm in length.

18. The apparatus of system of claim 1, wherein the amplifier has an input impedance greater than 1 GΩ.

19. The system of claim 1, wherein measurements of the potential are at frequencies below 1 kHz.

20. The system of claim 1, wherein the barrier includes a capacitive component and a resistive component, and wherein the capacitive component of the barrier is less than three times the resistive component of the barrier, within a range of frequencies of interest.

21. The system of claim 1, wherein a coupling of the barrier and the sensing plate has a coupling impedance with a coupling capacitive component less than ten times a coupling resistive component of the coupling impedance, at a frequency of interest.

22. A method for making a measurement of the electric potential within the earth comprising:

placing a sensing plate in an environment in close proximity to the earth to make a capacitive coupling to the earth potential and measure the earth's electric potential;
providing a barrier to inhibit an electrochemical reaction of the sensing plate with the earth, wherein a coupling of the barrier and the sensing plate has a resistance greater than 100 kΩ and a capacitance of the sensing plate greater than 100 nF;
sending a first signal carrying the potential measured by the sensing plate to an amplifier having at least one stage; and
comparing the potential measured by the sensing plate to a reference voltage, wherein the difference between the first and second potentials is used to determine one or more electric fields.

23. The method of claim 22 wherein the sensing plate is left in place for at least a week.

24. A method for making a measurement of the electric potential of underground formations within the earth comprising:
   placing at least a first sensing plate and a second sensing plate on or within the earth in order to make operative capacitive couplings of the first and second sensing plates with the earth potential;
   providing a first barrier to inhibit electrochemical reaction of the first sensing plate with the earth; and
   providing a second barrier to inhibit an electrochemical reaction of the second sensing plate with the earth;
   measuring the earth's electric potential with the first and second sensing plates; sending a first signal carrying the first potential measured by the first sensing plate to a first amplifier having at least one stage;
   sending a second signal carrying the second potential measured by the second sensing plate to a second amplifier having at least one stage;
   comparing the first potential measured by the first sensing plate to a first reference voltage;
   comparing the second potential measured by the second sensing plate to a second reference voltage;
   connecting outputs of the first and second amplifiers to a data acquisition system, and using the difference between the first and second potentials to determine one or more electric fields.

25. The method of claim 24, wherein at least one underground formation comprises a hydrocarbon reservoir.

26. The method of claim 25, wherein the measurements made with the sensing plate are used for collection of data for imaging of earth conductivity profiles using the magnetotelluric (MT) methods.

27. The method of claim 25, wherein the measurements made with the sensing plate are used for collection of data for imaging of earth conductivity profiles using controlled source electromagnetic (CSEM) methods.

28. The method of claim 25, wherein the first sensing plates and the barrier can be represented in a first equivalent circuit by a first capacitor $C_b$, and a first resistor $R_b$ in parallel, where the combination of the first capacitor $C_b$ and the first resistor $R_b$ represents the coupling impedance between the first sensing plate and the earth, with values of the first capacitor $C_b$ and the first resistor $R_b$ being determined by the properties of the first barrier, contact capacitance and resistance of the first barrier with the earth and bulk resistance of the first sensing plate, and wherein the first capacitor $C_b$ has a value greater than 100 nF.

* * * * *